United States Patent
Rode et al.

(10) Patent No.: US 8,563,129 B2
(45) Date of Patent: Oct. 22, 2013

(54) POLYSILAZANE-CONTAINING COATINGS FOR INCREASING THE CONVERSION EFFICIENCY OF ENCAPSULATED SOLAR CELLS

(75) Inventors: Klaus Rode, Wiesbaden (DE); Hartmut Wiezer, Eppstein (DE); Sandra Stojanovic, Frankfurt (DE); Hubert Liebe, Wiesbaden (DE); Lars Blankenburg, Kahla (DE)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 362 days.

(21) Appl. No.: 12/988,192

(22) PCT Filed: Apr. 17, 2009

(86) PCT No.: PCT/EP2009/002822
§ 371 (c)(1),
(2), (4) Date: Oct. 15, 2010

(87) PCT Pub. No.: WO2009/129967
PCT Pub. Date: Oct. 29, 2009

(65) Prior Publication Data
US 2011/0041913 A1 Feb. 24, 2011

(30) Foreign Application Priority Data
Apr. 23, 2008 (DE) .......... 10 2008 020 324

(51) Int. Cl.
*H01L 31/04* (2006.01)
*B05D 1/02* (2006.01)
*B32B 17/10* (2006.01)

(52) U.S. Cl.
USPC .......... 428/336; 427/508; 427/515; 428/428; 428/429; 428/447; 428/451; 524/588; 528/14; 528/21; 528/38

(58) Field of Classification Search
USPC .......... 428/336, 428, 429, 447, 451; 524/588; 528/14, 21, 38; 427/508, 515
See application file for complete search history.

(56) References Cited

U.S. PATENT DOCUMENTS

| 6,501,014 B1 * | 12/2002 | Kubota et al. ................. 136/256 |
| 8,309,228 B2 * | 11/2012 | Dierdorf et al. .............. 428/451 |
| 2007/0196672 A1 * | 8/2007 | Brand et al. .................. 428/447 |

FOREIGN PATENT DOCUMENTS

WO  WO 2005/085374 A1 * 9/2005
WO  WO 2007/028511 A2 * 3/2007

* cited by examiner

*Primary Examiner* — D. S. Nakarani
(74) *Attorney, Agent, or Firm* — Sangya Jain

(57) ABSTRACT

The invention relates polysilazane-containing coatings for increasing the light permeability of sun-facing covers of solar cells. The coating for surfaces contains at least one polysilazane of formula (1) —(SiRR'R"—NR'''1)n- (1), wherein R', R", R''' are the same or different or represent an optionally substituted alkyl, aryl, vinyl or (trialkoxysilyl)alkyl group, n being an integer and n being chosen in such a manner that the perhydropolysilazane has a number average molecular weight of 150 to 150,000 g/mol, a solvent and a catalyst. The cured coating has a thickness of at least 0.50-10 micrometer, preferably 0.2 to 5 micrometer, especially preferred 0.5 to 1.5 micrometer. It is especially suitable as transmission-promoting coating for use in sun-facing covers of solar cells.

25 Claims, 1 Drawing Sheet

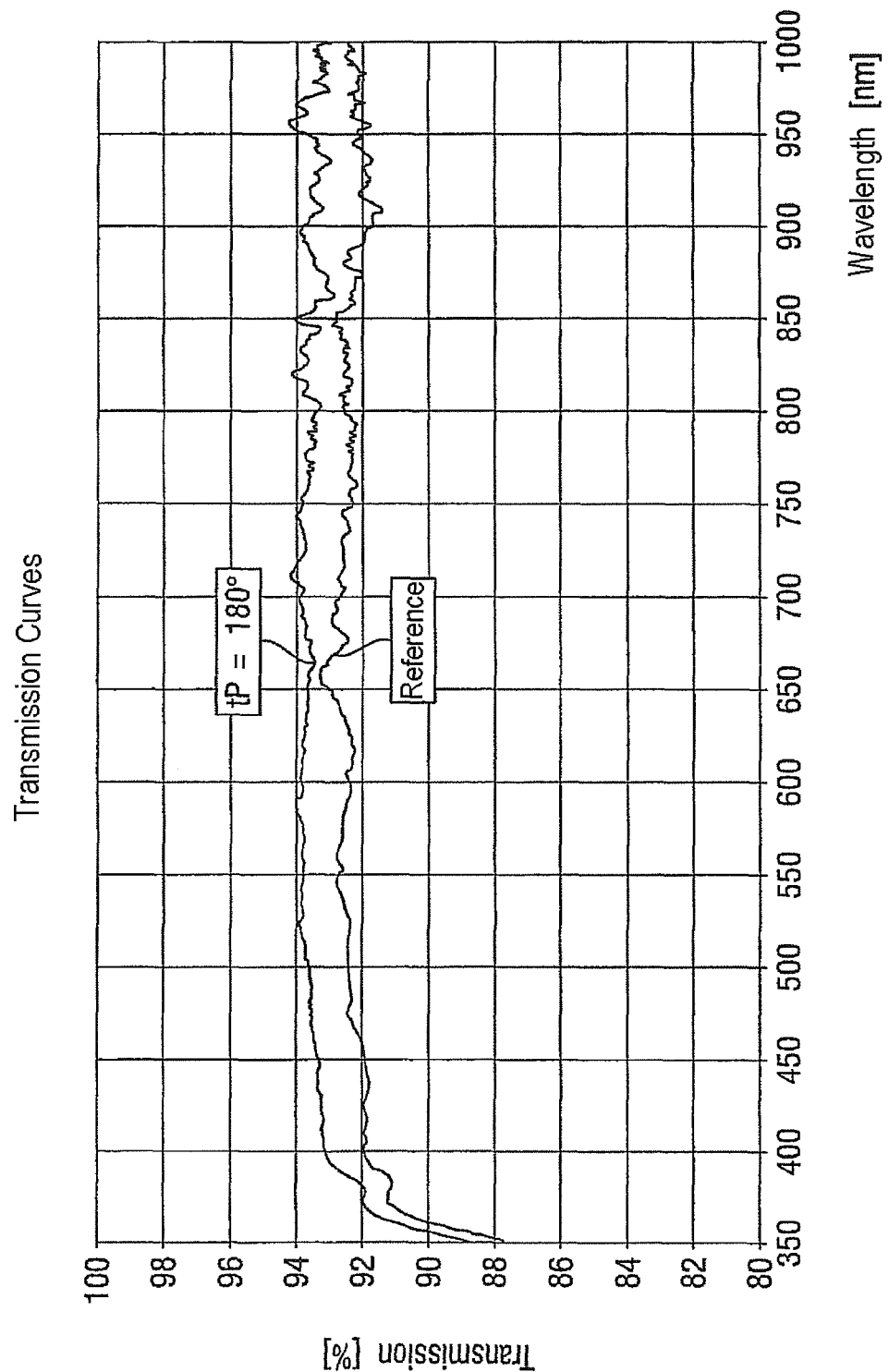

POLYSILAZANE-CONTAINING COATINGS FOR INCREASING THE CONVERSION EFFICIENCY OF ENCAPSULATED SOLAR CELLS

The present invention relates to the use of polysilazane-based coatings for the production of ceramic coatings which reduce reflection losses on transparent light-side coverings of solar cells, and therefore contribute to increasing the conversion efficiency of encapsulated solar cells.

One requirement of light-side coverings of solar cells, to protect for example against weathering effects, is to induce a minimal intensity loss by reflection of the electromagnetic solar radiation favorable for the solar cell.

It is known that reflection at interfaces reduces the transmission of light through transparent mediums. If an interface is the insolation-side encapsulation of a solar cell, then the effect of the reflection is that part of the incident light is not available for conversion into solar electricity.

Reflection losses at interfaces can be reduced by using antireflection layers. The use of antireflection layers on insolation-side encapsulations of solar cells, however, is only employed in special cases at present. Reasons for this are that they are elaborate and expensive to produce, and contemporary antireflection layers do not withstand the mechanical stresses during production and installation of photovoltaic systems or rough layers are susceptible to undesired contamination.

The use of interference layers is an established method for avoiding reflection at surfaces (H. A. Macleod, Thin-Film Optical Filters, Hilger: Bristol, UK (1986)). In this case, an optical layer with a layer thickness of ¼ is applied in order to reduce the light reflected at the interface between two optical mediums with different refractive indices. One disadvantage is that expensive multilayer systems are necessary for broadband reflection reduction, and elaborate methods such as PVD (physical vapor deposition) and CVD (chemical vapor deposition) or PIAD (plasma ion assisted deposition) and PECVD (plasma enhanced chemical vapor deposition) are necessary. Another disadvantage is the layer's lack of mechanical strength.

An alternative to avoiding reflection at surfaces by interference layers is offered by the use of layers which have a refractive index between that of air and the material. In order to avoid reflection at surfaces using a single layer, it is known to use a magnesium fluoride layer with a refractive index of 1.38. A disadvantage is that such layers have a low mechanical strength (H. Anders, Dünne Schichten für die Optik [Thin films for optics], Wiss. Verlagsgesellschaft Stuttgart (1965)).

Organic polymers with different refractive indices are also used to avoid reflection at surfaces. Disadvantages are adhesion problems, when these polymers are based on fluorine, and the high sensitivity to mechanical stress (DE 699 04 530 T2).

Porous layers, produced for example by the sol-gel method, are also used to avoid reflections at surfaces. In this case, the volume fractions of different mediums, i.e. the porosity (for example by the size and thickness of the pores), are used in order to adjust the refractive index so that less light is reflected ("Verfahren und Beschichtungszusammensetzung zur Herstellung einer Antirefexionsbeschichtung" [Method and coating composition for producing an antireflection coating]), laid-open specification of German patent application DE 196 42 419 A1 (1998) or nanoporous layers [U. Steinert, S. Walheim, E. Schäffer, S. Eggert, J. Mlynek, University of Constance] ("Verfahren zur Herstellung von Anti reflexschichten" [Method for producing antireflection layers]), laid-open specification of German patent application DE 198 29 172 A1 (2000).

One disadvantage with porous layers is that the formation of these layers, when it is based on sol-gel methods, requires high temperatures which are not suitable for plastic substrates. Another disadvantage is that surfaces treated in this way are susceptible to permanent contamination in the pores.

A surface roughened by etching can likewise be used to avoid reflection at surfaces. Instead of etching the surface, however, a structure (moth-eye) may also be imparted to it. Disadvantages are that the structures are elaborate to produce and the roughened surfaces are susceptible to permanent contamination.

It is an object of the present invention to provide a coating to avoid reflection at transparent light-side coverings of solar cells, which does not present the disadvantages of the methods mentioned above and can be applied in a straightforward and economical way.

The present invention achieves this object and relates to a method for producing a reflection-reducing transparent coating on solar cells, and to the use of polysilazane-based solutions for producing the transparent light-side (the side facing toward the light) coverings on solar cells.

Surprisingly, it has been found that solutions containing polysilazanes can produce very thin protective layers whose refractive index lies between air and surfaces which can be used for transparent light-side coverings of solar cells.

BRIEF DESCRIPTION OF THE DRAWING

FIG. 1 is a graphical representation of transmission improvement.

The invention therefore provides a transmission-increasing coating for insolation-side coverings of solar cells, containing at least one polysilazane having the following formula 1

where R', R", R'" are identical or different and stand independently of one another for hydrogen or an optionally substituted alkyl, aryl, vinyl, or (trialkoxysilyl)alkyl radical, n being an integer and n being selected so that the polysilazane has a number-average molecular weight of from 150 to 150,000 g/mol, and optionally a solvent and/or a catalyst and one or more cobinders.

In one preferred embodiment, solutions which contain at least one perhydropolysilazane of Formula 2 are used

In another preferred embodiment, the coating according to the invention contains at least one polysilazane of Formula 3

where R', R", R'", R*, R and R* stand independently of one another for hydrogen or optionally a likewise substituted alkyl, aryl, vinyl or (trialkoxysilyl)alkyl radical, n and p being integers and n being selected so that the polysilazane has an average molecular weight of 150-150,000 g/mol.

Particularly preferred compounds are ones in which

R', R''' and R*** stand for hydrogen and R", R* and R** stand for methyl;

R', R''' and R*** stand for hydrogen, R", R* stand for methyl and R** stands for vinyl;

R', R''', R* and R* stand for hydrogen and R" and R stand for methyl.

Solutions which contain at least one polysilazane of Formula (4) are likewise preferred

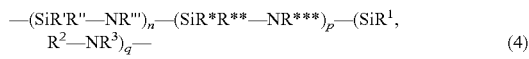

(4)

where

R', R", R*, R, R*, R$^1$, R$^2$ and R$^3$ stand independently of one another for hydrogen or an optionally substituted alkyl, aryl, vinyl or (trialkoxysilyl)alkyl radical, n, p and q being integers and n being selected so that the polysilazane has a number-average molecular weight of from 150 to 150,000 g/mol.

Compounds in which R', R''' and R*** stand for hydrogen, R", R*, R** and R$^2$ stand for methyl, R$^3$ stands for (triethoxysilyl)propyl and R$^1$ stands for alkyl or hydrogen are particularly preferred.

In general, the proportion of polysilazane in the solvent is from 1 to 80 wt % polysilazane, preferably from 5 to 50 wt %, particularly preferably from 10 to 40 wt %.

The solvents are inert aprotic solvents, in particular toluene, xylene, ether or n-dibutyl ether etc.

Further constituents of the perhydropolysilazane may be additives which influence for example the viscosity of the formulation, substrate wetting, film formation or the deaeration behavior, or organic and inorganic UV absorbers.

The coating solution according to the invention contains from 1 to 40 wt % of at least one perhydropolysilazane of Formula (1) and optionally from 0.001 to 5 wt %, preferably from 0.01 to 2 wt %, of a catalyst.

Suitable catalysts are N-heterocyclic compounds such as 1-methylpiperazine, 1-methylpiperidine, 4,4'-trimethylene-dipiperidine, 4,4'-trimethylene-(1-methylpiperidine), diazobicyclo-(2,2,2)octane, cis-2,6-dimethylpiperazine.

Other suitable catalysts are mono-, di- and trialkylamines such as methylamine, dimethylamine, trimethylamine, phenylamine, diphenylamine and triphenylamine, DBU (1,8-diazabicyclo(5,4,0)-7-undecene), DBN (1,5-diazabicyclo(4,5,0)-5-nonene), 1,5,9-triazacyclododcane and 1,4,7-triazacyclononane.

Other suitable catalysts are organic and inorganic acids such as acetic acid, propionic acid, butyric acid, valeric acid, maleic acid, stearic acid, hydrochloric acid, nitric acid, sulfuric acid, phosphoric acid, chloric acid and hypochlorous acid.

Other suitable catalysts are metal carboxylates with the general formula (RCOO)$_n$M of saturated and unsaturated, aliphatic or alicyclic $C_1$-$C_{22}$ carboxylic acids and metal ions such as Ni, Ti, Pt, Rh, Co, Fe, Ru, Os, Pd, Ir and Al; n is the charge of the metal ion.

Other suitable catalysts are acetylacetonate complexes of metal ions such as Ni, Pt, Pd, Al and Rh.

Other suitable catalysts are metal powders such as Au, Ag, Pd or Ni with a particle size of from 20 to 500 nm.

Other suitable catalysts are peroxides such as hydrogen peroxide, metal chlorides and metalorganic compounds such as ferrocenes and zirconocenes.

The coating according to the invention is suitable in particular for producing a transparent reflection-reducing light-side covering of solar cells which consist of glass or plastic.

The proportion of nitrogen in the coating is preferably 0-5 atom %.

The solar cell covering may be coated with the polysilazane formulation by methods which are conventionally employed in coating technology. This may, for example, involve spraying, dip coating or flow coating. A thermal retreatment may subsequently be carried out, in order to accelerate the curing of the coating. Depending on the catalyst used, the curing may already take place at room temperature.

For temperature-sensitive substrates, curing may also be carried out at low temperatures by means of VUV. According to the thermal stability of the substrate, VUV radiation having wavelength components in the range <180 nm-230 nm may be used for curing.

The invention therefore likewise provides solar cells which are coated with the coating solution described above. The solar cell coverings preferably consist of plastic or glass.

The invention furthermore provides a method for producing a transparent reflection-reducing light-side covering of solar cells on a transparent substrate, wherein the polysilazane solution optionally containing a catalyst is applied onto the substrate by suitable methods such as for example spraying or dip coating. For substrates which are suitable for roll-to-roll coating, it has surprisingly been found that using a slit nozzle as the application system leads to very homogeneous thin layers. The coating may subsequently be ceramized either by the effect of temperature or by the effect of temperature coupled with shortwave irradiation, for example according to DE 10 2005 034 817 A1.

The temperature for the ceramization on less thermally labile substrates lies between 20 and 500° C., preferably between 20 and 250° C., and particularly preferably at 200° C.

The temperature for the ceramization on thermally labile substrates lies between 20 and 180° C., preferably between 20 and 120° C., and particularly preferably at 90° C.

The cured coating has a layer thickness of 0.05-10 micrometers, preferably from 0.2 to 5 micrometers, particularly preferably from 0.5 to 1.5 micrometers, and ensures broadband transmission improvement.

The cured antireflection coating furthermore has an excellent mechanical stability.

It is therefore possible by simple means to produce a transmission-increasing coating which functions over a large wavelength range and has high mechanical strength.

EXAMPLES

Example 1

A plastic sheet (Pütz140/A, PET, from Pütz-Folien, pretreated on the inner side, 71 μm thick) was roll-to-roll coated on one side with a PHPS solution (NL120-05+5% DEAE) using a slit nozzle.

Dosing: variably predosed via spray/pump.
Slit nozzle with gap width: 75 μm
Application angle: 60°
Coating width: 1.5 cm
Speed: 1 m/min, residence time in the drier approx. 15 min
Drier temperature: 95-100° C. (layer 90-95° C.)
Air humidity: 61%
IR: 200 W
Corona: 200 W A layer adhesion test according to DIN 58196-6 showed no layer tears.

After storage for one day at RT, no Si—H absorption bands could be detected any longer by IR.

Scratch resistance: the coatings were placed under a weight of 250 g with rotating (60 rpm) steel wool of fineness 000. The samples were visually inspected for the number of scratches. The results were divided into five scratch-proof categories: a: no scratches, b: no more 2 scratches, c: 3-5 scratches, d: 6-10 scratches, e: no fewer than 11 scratches PET: abrasion category e
Coated PET sheet: a-b
Measurement Results:

| Sample | Type [a] | d [b] [nm] | $n_{600}$ [b] | Difference in $n_{600}$ from 140A | Transmission improvement [%] in nm [c] | | | | | |
|---|---|---|---|---|---|---|---|---|---|---|
| | | | | | 400 | 500 | 600 | 800 | 400-800 | 801-1000 |
| 1 | 140B | 99 | 1.48 | 0.25 | 4.8 | 5.6 | 4.7 | 3.0 | 4.2 | 2.3 |
| 10 | 140B | 77 | 1.54 | 0.19 | 6.1 | 3.7 | 2.4 | 1.2 | 3.4 | 0.4 |
| 11 | 140B | 107 | 1.49 | 0.24 | 4.5 | 4.9 | 4.0 | 2.8 | 3.8 | 1.5 |
| 12 | 140B | 67 | 1.47 | 0.26 | 6.2 | 4.6 | 3.0 | 1.9 | 3.3 | 1.2 |
| 13 | 140B | 112 | 1.52 | 0.20 | 5.9 | 5.4 | 4.0 | 1.9 | 3.8 | 1.9 |
| | 140B average | | | | 5.5 | 4.8 | 3.6 | 2.2 | 3.7 | 1.5 |
| 7 | 140R6/100 | 66 | 1.51 | 0.22 | 2.4 | 2.3 | 1.5 | 0.3 | 1.2 | 0.9 |
| 8 | 140B + R6 | 140 | 1.47 | 0.26 | −0.2 | 3.1 | 4.0 | 3.4 | 2.8 | 3.2 |
| 9 | 140R30/100 | 93 | 1.46 | 0.27 | 2.2 | 4.1 | 3.5 | 2.0 | 2.9 | 3.0 |
| 1, 14, 15, 16, 17 | 140A | | 1.73 | | | | | | | |

[a] respectively different sample pieces, sheet thickness determined after ellipsometry preparation: ⌀ coated 81.4 μm; ⌀ uncoated 83.2 μm;
[b] determined by ellipsometry
[c] in relation to an averaged transmission of 5 samples of 140A
140B = Pütz 140/A, PET, from Pütz-Folien, pretreated on the inner side, 71 μm thick coated with PHPS
R = doctor blade coating Example 2

Plastic sheet (Melinex 506, thickness 100 μm, polyester, from Cadillac Plastic) was coated on one side with a PHPS solution (NL120-05+5% DEAE) using a doctor blade. Drying 15 min at 95° C. After storage for two days in air at RT, Si—H absorption bands could no longer be found.

PET: abrasion category e
Coated PET sheet: a-b
Measurement Results

| Type [a] | d [b] [nm] | $n_{600}$ [b] | Difference in $n_{600}$ from 140A | Transmission improvement [%] in nm [c] | | | | | |
|---|---|---|---|---|---|---|---|---|---|
| | | | | 400 | 500 | 600 | 800 | 400-800 | 801-1000 |
| 140R4 | 64 | 1.52 | 0.21 | 4.4 | 2.8 | 1.9 | 1.5 | 2.2 | 0.6 |
| 140R20 | 87 | 1.55 | 0.18 | 5.2 | 4.3 | 3.3 | 2.2 | 3.6 | 1.9 |
| 140R50 | 121 | 1.53 | 0.20 | 1.9 | 3.7 | 3.8 | 2.8 | 3.4 | 2.1 |
| 140R50x2 | 165 | 1.46 | 0.27 | −0.6 | 0.0 | 1.9 | 3.7 | 1.4 | 2.6 |
| 140A | | 1.73 | | | | | | | |

[a] doctor blade coating: spiral doctor blade R, different gap height 4 μm, . . .
[b] determined by ellipsometry
[c] in relation to "uncoated" transmission of the respective sample at exactly the same position Example 3

PET sheet was roll-to-roll coated on one side with a PHPS solution (NL120-05+5% DEAE), dried for 10 min at room temperature and cured with VUV at room temperature and circulation with a speed of 1 m/min ($Xe_2$ excimer radiation 100 mJcm$^{-2}$ and Hg-LP radiation 250 mJcm$^{-2}$).

Measurement Results:
The transmission improvement averaged between 400-1100 nm was 2.1%.
PET: abrasion category e
Coated PET sheet: a-b Example 4

Glass was coated on both sides with a 20% strength PHPS solution (NL 120 A 5% DEAE) with a drawing rate of 0.3 m/min in air by dip coating into the solution. After drying (about 10 min) at room temperature, the coated glass samples were put into an oven in air at 180° C. with a holding time of 1 h.

The layer had a thickness of 1 μm.
Glass: 4 mm horticultural sheet glass $n_{605}$=1.524
PHPS layer: double-sided layer thickness (ellipsometry)≈240 nm
$n_{605}$=1.417, $\Delta n = n_{605}$ (glass)−$n_{605}$ ($SiO_x$)=0.107
Measurement Results, Transmission Improvement:
400-800 nm: 0.51%
801-1100 nm: 0.75%
400-1100 nm: 0.62%
Maximum value 1.7% at 500 nm
Abrasion Category:
Glass: a
Coated glass: a

Example 5

Glass was coated on both sides with a 20% strength PHPS solution (NL 120A) with a drawing rate of 0.3 m/min in air by dip coating into the solution. After drying (about 30 min) at room temperature, the coated glass samples were put into an oven in air at 180° C. with a holding time of 1 h.

Abrasion Category:
  Glass: a
  Coated glass: a
Measurement Results:

| Glass | $d_{SiOx}{}^{a)}$ [µm] | $n_{605}$ Glass[a] | $n_{605}$ $SiO_x{}^{a)}$ | $\Delta n$ [b] | Transmission improvement [%] in nm [c] | | |
|---|---|---|---|---|---|---|---|
| | | | | | 400-800 | 801-1100 | 400-1100 |
| 1 | 0.2 | 1.502 | 1.394 | 0.108 | 0.97 | 0.76 | 0.88 |
| 2 | 1.9 | 1.513 | 1.492 | 0.021 | 0.93 | 0.71 | 0.83 |
| 3 | 0.2 | 1.504 | 1.413 | 0.091 | 0.37 | 0.48 | 0.42 |

[a] determined by ellipsometry
[b] $\Delta n = n_{605}$ (glass) $- n_{605}$ (SiO$_x$)
[c] in relation to "uncoated" transmission, measured on the respectively uncoated half of glass

Example 6

Glass was coated on both sides using a TutoProm® solution with a drawing rate of 0.3 m/min in air by dip coating into the solution. After drying (about 30 min) at room temperature, the coated glass samples were put into an oven in air at 180° C. with a holding time of 1 h.

For the transmission improvement, see the diagram (FIG. 1):

The invention claimed is:

1. A method for producing a transparent reflection reducing light-side covering of solar cells on a transparent substrate, for producing insolation-side coverings of solar cells comprising the step of applying a polysilazane-containing solution comprising at least one polysilazane having the following formula $$—(SiR'R''—NR''')_n— \quad (1)$$

where
  R', R'', R''' are identical or different and stand independently of one another for hydrogen or an optionally substituted alkyl, aryl, vinyl or (trialkoxysilyl)alkyl radical, n being an integer and n being selected so that the polysilazane has a number-average molecular weight of from 150 to 150,000 g/mol, and optionally a solvent, a catalyst or a combination thereof and one or more co-binders, onto a substrate to form a coating and the coating is subsequently ceramized either by the effect of temperature coupled with VUV radiation having wavelength portions <230 nm or UV radiation having wavelength portions between 230 and 300 nm.

2. The method according to claim 1, wherein the solvent is an inert aprotic solvent.

3. The method according to claim 1, comprising from 1 to 40 wt % of at least one perhydropolysilazane of Formula (1) and optionally from 0.001 to 5 wt %, of a catalyst.

4. The method as claimed in claim 3, wherein the coating solution comprises from 0.01 to 2 wt % of a catalyst.

5. The method according to claim 1, wherein the catalyst is selected from the group consisting of: N-heterocyclic compounds, mono-, di- and trialkylamines, organic acids, inorganic acids, acetylacetonate complexes of metal ions, metal-carboxylates with the general formula $(RCOO)_nM$ of saturated and unsaturated, aliphatic or alicyclic $C_1$-$C_{22}$ carboxylic acids and metal ions; where n is the charge of the metal ion, or metal powders with a particle size of from 20 to 500 nm, peroxides, metal chlorides and metalorganic compounds.

6. The method as claimed in claim 5, wherein the coating solution comprises the metal ions of the acetylacetonate complexes of metal ions are Ni, Pt, Pd, Al or Rh.

7. The method as claimed in claim 5, wherein the coating solution comprises the metal ions of the metal carboxylates with the general formula $(RCOO)_nM$ are Ni, Ti, Pt, Rh, Co, Fe, Ru, Os, Pd, Ir or Al.

8. The method as claimed in claim 5, wherein the coating solution comprises the metal powders containing Au, Ag, Pd or Ni.

9. The method as claimed in claim 5, wherein the coating solution comprises metalorganic compounds are ferrocenes or zirconocenes.

10. The method according to claim 1, wherein R', R'', R''' in Formula (1) stand independently of one another for a radical selected from the group consisting of hydrogen, methyl, ethyl, propyl, iso-propyl, butyl, isobutyl, tert.-butyl, phenyl, vinyl, (triethoxysilyl)-propyl, and 3-(trimethoxysilylpropyl).

11. The method according to claim 1, wherein the solution contains at least one perhydropolysilazane of Formula (2)

12. The method according to claim 1, wherein the solution contains at least one polysilazane of Formula (3)

$$—(SiR'R''—NR''')_n—(SiR^*R^{}—NR^{*})_p— \quad (3)$$

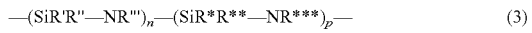

where
  R', R'', R''', R*, R and R* stand independently of one another for hydrogen or an optionally substituted alkyl, aryl, vinyl or (trialkoxysilyl)alkyl radical, n and p being integers and n being selected so that the polysilazane has a number average molecular weight of from 150 to 150,000 g/mol.

13. The method according to claim 12, wherein in Formula (3) R', R''' and R*** are hydrogen and R'', R* and R are methyl; R', R''' and R* are hydrogen, R'', R* are methyl and R** stands for is vinyl; or R', R''', R* and R* stand for hydrogen and R'' and R are methyl.

14. The method according to claim 1, wherein the solution contains at least one polysilazane of Formula (4)

$$-(SiR'R''—NR''')_n—(SiR^*R^{**}—NR^*)_p—(SiR^1,R^2—NR^3)_q— \quad (4)$$

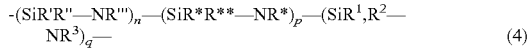

where
  R', R'', R''', R*, R, R*, R$^1$, R$^2$ and R$^3$ are independently of one another hydrogen or an optionally substituted alkyl, aryl, vinyl or (trialkoxysilyl)alkyl radical, n, p and q being integers and n being selected so that the polysilazane has a number-average molecular weight of from 150 to 150,000 g/mol.

15. The method as claimed in claim 1, characterized in that wherein the solution is applied onto the substrate by an application system and wherein the application system is spraying, flow coating or dip coating.

16. The method as claimed in claim 1 wherein the coating is applied with a slit nozzle.

17. The method as claimed in claim 1, wherein VUV radiation having wavelength components in the range from 180 nm to less than 230 nm is used, according to the thermal stability of the substrate.

18. The method as claimed in claim 1, wherein ceramized coating has a layer thickness of 0.05-10 micrometers.

19. The method as claimed in claim 1, wherein the substrate is made of glass or plastic.

20. The method as claimed in claim 1 further comprising a coating solution solvent selected from a group consisting of is toluene, xylene, either and n-dibutyl ether.

21. A solar cell coated using the method as claimed in claim 1.

22. The solar cell as claimed in claim 21, wherein the ceramized coating has a layer thickness of 0.05-10 micrometers.

23. The solar cell as claimed in claim 21, wherein the solar cell is made of glass or plastic.

24. A process for producing the insolation-side covering of a solar cell comprising the step of applying to the insolation-side covering a solution containing at least one polysilazane having the following formula $$-(SiR'R''-NR''')_n- \qquad (1)$$

where R', R'', R''' are identical or different and stand independently of one another for hydrogen or an optionally substituted alkyl, aryl, vinyl or (trialkoxysilyl)alkyl radical, n being an integer and n being selected so that the polysilazane has a number-average molecular weight of from 150 to 150,000 g/mol, and optionally a solvent, a catalyst or a mixture thereof and one or more co-binders, onto a suitable substrate to form a coating and this coating is subsequently ceramized either by the effect by the effect of temperature coupled with VUV radiation having wavelength portions <230 nm or UV radiation having wavelength portions between 230 and 300 nm.

25. An insolation-side covering of a solar cell made in accordance with the process of claim 24.

* * * * *